United States Patent [19]
Dabiri

[11] Patent Number: 5,815,515
[45] Date of Patent: Sep. 29, 1998

[54] EDGE METRIC CALCULATION METHOD AND APPARATUS USING PERMUTATIONS

[75] Inventor: Dariush Dabiri, San Jose, Calif.

[73] Assignee: LSI Logic Corporation

[21] Appl. No.: 822,412

[22] Filed: Mar. 21, 1997

Related U.S. Application Data

[60] Provisional application No. 60/014,394, Mar. 28, 1996.
[51] Int. Cl.[6] .................................................. H03M 13/12
[52] U.S. Cl. ......................................... 371/43.7; 371/43.8
[58] Field of Search ................................... 371/43.7, 43.8

[56] References Cited

U.S. PATENT DOCUMENTS

| | | | |
|---|---|---|---|
| 4,829,525 | 5/1989 | Sugiyama et al. | 371/38 |
| 4,845,713 | 7/1989 | Zook | 371/37 |
| 5,280,489 | 1/1994 | Fredrickson et al. | 371/45 |
| 5,430,743 | 7/1995 | Marturano et al. | 371/43 |

OTHER PUBLICATIONS

Sparso et al., "An Area Efficient Topology for VLSI Implementation of Viterbi Decoders and Other Shuffle–Exchange Type Structures," IEEE J. Solid State Circ., vol. 26, No. 2, Feb. 1991, pp. 90–97.

Fettweis, G., "Algebraic Survivor Memory Management Design of Viterbi Decoders," IEEE Trans. Communications, vol. 43, No. 9, Sep. 1995, pp. 2458–2463.

Hekstra, A., "An Alternative to Metric Rescaling in Viterbi Decoders," IEEE Trans. Communications, vol. 37, No. 11, Nov. 1989, pp. 1220–1222.

Rader, C.M., "Memory Management in a Viterbi Algorithm," IEEE Trans. Communications, vol. 29, No. 9, Sep. 1981, pp. 1399–1401.

Cypher, R. et al, "Generalized Trace–Back Techniques for Survivor Memory Management in the Viterbi Algorithm," Journal of VLSI Signal Processing, vol. 5, 1993, pp. 85–94.

Feygin, G. et al., "Architectural Tradeoffs for Survivor Sequence Management in Viterbi Decoders," IEEE Trans. Communications, vol. 1, No. 3, Mar. 1993, pp. 425–429.

*Primary Examiner*—Stephen B. Baker
*Attorney, Agent, or Firm*—Kevin L. Daffer; Conley, Rose, Tayon

[57] ABSTRACT

This invention concerns a novel Viterbi decoding apparatus and method in which a novel survivor weight unit (SWU) implements a normalized survivor weight calculation method with permutations. This method permutes a vector of survivor weights in a manner which permits calculation of weights by specialized dual add-compare-select units. The specialization of the butterfly computation unit allows for a reduction of storage and computation requirements.

9 Claims, 7 Drawing Sheets

EDGE METRIC CALCULATION METHOD AND APPARATUS USING PERMUTATIONS

BACKGROUND OF THE INVENTION

This application claims the benefit of U.S. Provisional Application No. 60/014,394 filed Mar. 28, 1996.

1. Field of the Invention

This invention relates to a method and apparatus for decoding convolutionally encoded signals. Such signals are commonly used in communications and recording systems which employ error correction to combat signal corruption. The convolutional decoders discussed here are based on the Viterbi algorithm, in which weights are calculated for transitions which form survivor paths through a decoder trellis. The decoding then takes the form of tracing the most likely survivor path. More specifically, this invention concerns a novel method for calculating survivor path weights which when implemented leads to a significant reduction in circuit complexity and silicon area needed to implement the convolutional decoder apparatus hereof.

2. Description of the Relevant Art

Error correction codes function by accepting input data symbols and processing them in such a way as to add some redundancy to the symbol sequence. One way this is commonly done is to increase the number of symbols in the sequence, so that for every k symbols that enter the encoder, n symbols are dispatched by the encoder. The input and output symbols are generally binary digits (bits), and the information throughput is represented as a code rate of k/n. The k input symbols form one input data word, and the n output symbols form a code word. For this reason, the code rate k/n is normally not reduced if k and n share common factors.

The most popular form of error correction codes are block codes. Block codes are characterized by the feature of state-independent decodability. A block encoder can be implemented as a lookup table in which the input data word is used as an address, and the code word corresponding to the input data word is given by the contents of the table at that address. In this way a one-to-one mapping from input data words to code words is achieved. A simple decoding algorithm is to compare a received code word to all possible code words, choose the "closest" code word, and use the chosen code word as an address in a second lookup table that contains the input data word which corresponds to the chosen code word. The state-independence is a result of the one-to-one mapping that ensures each code word has only one possible interpretation. One drawback of block coding is that for adequate performance, many systems require codes with very long block lengths, necessitating large memories or more complex encoding and decoding algorithms.

As an alternate approach, short block lengths can be used, but some restrictions are added to the way in which code words can be used. With block coding, each of the code words could be used at any time as dictated by the current input data word. This is not the case with convolutional coding, where the code words which can be used are influenced by previous input data words as well as the current input data word. This increases the effective "length" of code words by extending the range of influence of an input data word beyond one code word. As a consequence, however, there is not a one-to-one mapping from the input data words to code words, and the encoding and decoding processes are more involved.

FIG. 1 illustrates one example of a convolutional encoder. Encoder 110 includes a series of adders 116 interposed between a shift registers 114 and a time multiplexer 118. Encoder 110 accepts one bit at each time step and produces two bits. Shift register 114 shifts its contents to the right one bit per time interval, accepting a new bit from the input data stream 112 in the process. Shift register 114 exemplifies a four-bit wide register which contains the current input data bit and the three previous data bits. The three previous bits are considered to form the "encoder state". When the shift register shifts again to the right, the current input data bit will become the most significant bit of the encoder state, thereby causing a transition to the new state. As more input data enters the shift register and the register again shifts, another transition occurs. As these transitions continue to occur, a sequence forms. This sequence of transitions between encoder states is often referred to as a path.

Associated with each transition in the path is a two bit code word that is formed based on the current input bit and the current encoder state. The contents of the shift register 114 are added together in different ways by two adders 116. The top adder adds the values of the first, third and fourth bits in the shift register. The bottom adder adds the values of the first, second and fourth bits. In each case, the summation is done modulo two, so that the output of the adder is one if the result is odd, and zero if the result is even. The adder outputs are passed to the time multiplexer 118 to form the output code word. Time multiplexer 118 then switches twice to pass its contents to the output line 120 before the next input bit is accepted. The rate of this encoder is thus ½. The number of encoder states is $2^3=8$ since three previous input bits are held in shift register 114.

In summary, convolutional encoder 110 accepts one input bit ($I_1$) per time step and calculates a two bit code word based on the input bit and the encoder state, wherein the encoder state shown comprises the past three input bits ($S_1$, $S_2$ and $S_3$). The sequence of code words passes through a transmission channel which is typically subject to interference (i.e. channel disturbances which may include random noise) that may corrupt the sequence of code words. To decode the code word sequence, a decoder will attempt to reverse the encode process and decide what the input bit is, based on the code word and state of the encoder. However, the decoder does not know for certain what the state of the encoder is, so the decoder often maintains a decision unit for each possible encoder state. The decoding decision will be based on the most likely sequence of encoder states as determined by the sequence of code words.

To decode the code word sequence, a time-expanded version of the encoder state transition diagram is formed. When all of the possible transitions from a state at time t to a state at time t+1 are shown, the resulting diagram is one stage (hereafter called a time step) of a trellis. FIG. 2 depicts an example of one time step of a decoder trellis. The eight states the encoder could be in at a given time t are listed on the left in FIG. 2, and the eight states the encoder could be in at time t+1 are listed on the right. The lines (hereafter referred to as edges) in FIG. 2 represent the possible state transitions. For example, if at time t the encoder is in state 000 and the current input bit is 1, at time t+1 the encoder will be in state 100. The only other possible transition from state 000 at time t occurs when the current input bit is 0, which results in a transition to state 000 at time t+1. For all states shown, the uppermost edge illustrates a state transition resulting from a current input bit of 0, and the lower edge illustrates a state transition resulting from a current input bit of 1. The trellis shown in FIG. 2 thereby duplicates the effects of shift register 114 which produces a state transition by shifting the current input bit into the most significant bit position of the encoder state.

Shown in FIG. 2 are the code words that correspond to each transition from state t to t+1. The code words are those produced by encoder 110 based on the current input bit and the encoder state. For an input bit of 0 the state transition from 000 at time t to 000 at time t+1 corresponds to an output code word of 00. This correspondence was determined from FIG. 1 where it can be seen that when $I_1$, $S_1$, $S_2$, and $S_3$ are zero, the adders 116 both produce a zero output, causing $C_1$ and $C_2$ to be zero. Similarly, the encoder state transition from 000 at time t to 100 at time t+1 corresponds to an output code word of 11. This time when using FIG. 1, $I_1$ equals one, while $S_1$, $S_2$, and $S_3$ are zero, resulting in summers 116 all producing an output of one, causing $C_1$ and $C_2$ to be one.

FIG. 2b shows a time expansion of the decoder trellis. At each time step the decision units contain the weight of the most likely path to the state of interest. Thus, the decoder trellis contains multiple paths from an initial state to a given state several time steps later; however, only one path has the lowest weight and therefore is the most likely path. The most likely path to a particular state within a given time step is found by starting at that particular state at that given time step and tracing backward along the chosen transitions which are drawn with the thick lines. If no more code words are received, the decoding may be performed by choosing the state at time t=6 with the smallest weight as the most likely encoder state and following the most likely path to that state from left to right. An input bit of 0 is decoded if the path follows the top transition from a state, and a 1 is decoded if the path follows the bottom transition from a state. In FIG. 2b the decoded data as indicated by the trail of thickest lines found by tracing backward from state 001 at time t=6 is 0 0 1 1 0 0. Details on the calculation of the weights and selection of the transitions follow.

The decoder is initialized by setting the weight of the first state (e.g. state A) at time t=0 to zero and the rest of the weights of states at time t=0 to a large number (in the figure this number is represented by X). This is done because it has been decided ahead of time that the initial state of the encoder is 000. Thereafter as code words come in at each time step, a metric (defined here to be a measure of difference between two signals) is formed for each code word which effectively measures the distance from the signal received at that time step to the code word. Classically, the metric used is the squared Euclidean distance. As an example, assume that at time t=0 the received signal is 10. Then the metrics M for each of the four possible code words are $(c_1-1)^2+(c_2-0)^2$ which yields the following results:

$$M^t_{00}=1 \ M^t_{01}=2 \ M^t_{10}=0 \ M^t_{11}=1$$

where $M^t_c$ equals the metric at time t for code word c.

Each state at time t>0 has associated with it a weight and a path. As will be explained in greater detail further below, the weight associated with each state is defined as the sum of the metrics formed by the most likely path to that state. In the example provided in FIG. 2b, the weights of each state at state t=1 starting at the top state and traversing downward are 1XXX1XXX. Likewise the weights of each state at state t=6 starting at the top state are 42354435. The path to a state is the most likely sequence of transitions that would have been taken by the encoder if indeed it is in that state. As an example, the received codeword upon the decoder is 10, followed by 01, followed by 11, etc. However, instead of 10 at time t=0, the decoder should have received 00 or 11. The distance (metric) between the received signal and codeword 00 is 1. Thus, the transition from state A in state t=0 to state B at time t=1 has a metric of 1. The weight of a transition is found by adding the metric to the weight of the state from which it originates. The transition from state A to state B thus has a weight of 0+1. Similarly, the distance between 10 and 11 (i.e., code word for input bit of 1 and a transition from state 000 to state 100—shown in FIG. 2) is 1. Thus, the metric from state A to state C is 1. The weight of the transition from A to C is then 0+1. The weight of state B or state C is the minimum weight of the incoming transitions. Thus, since the weight of the transition from state A to state B is 1, and the weight of the other incoming transition is a large number, then the weight of state B is 1. Similarly, the weight of state C is 1. The transitions which are chosen as having the minimum weights become path extensions. If at state C, the transition from state A to state C is chosen as the incoming transition with minimum weight, the most likely path to state C becomes the most likely path to state A plus the transition from state A to state C.

At any given time the encoder has only one state, but the decoder maintains a decision unit for all possible encoder states. The decision units each track the weight of one state, and their decisions are passed to a memory unit which tracks the corresponding paths.

The weight associated with each state is defined as the sum of the metrics corresponding to the transitions that form the most likely path to that state. In the decoder trellis shown in FIG. 2b, each of the states has two incoming transitions which are possible extensions of the paths to the originating states. The weight of each state at time t+1 is found by choosing the minimum weight of the two incoming transitions, where the weight of a transition is defined as the sum of the weight of the state it originates from and the metric of the code word that corresponds to that transition. The new path for the state at time t+1 is then the path to the originating state (at time t) of the transition that was chosen plus the chosen transition. Thus, the new path is the path to the originating state with a path extension which is the chosen transition.

The decoding method described above may be applied to more than just convolutional codes. Trellis codes are a more general form of convolutional codes. Much of what has been said above and all of what is discussed henceforth applies equally well to the more general class of trellis codes.

The aforesaid decoding method was conceived by A. J. Viterbi who realized that any paths which merged to a common encoder state would have the same possible extensions and hence would not possess any distinguishing characteristics beyond that point. Therefore, making a decision at the merge point does not cause any loss of optimality, but will significantly reduce the decoding complexity since only a constant number of paths needed to be kept in memory. Even so, the decoding algorithm outlined above still possesses significant complexity in that each edge of the decoder trellis requires the calculation of a weight value, and each state requires a comparison and selection process to be performed to determine the transition with the minimum weight.

As an exercise to illustrate the complexity of the decoder, consider the steps taken by the decoder to update the state weights after a code word is received. First, a metric is calculated for each of the possible code words. For this example that translates into two additions, two squarings, and one more addition for each of four code words yields 12 additions and 8 multiplications. Second, a weight is calculated for each edge in the trellis diagram. For this simple example there are 16 edges, necessitating 16 additions. Third, for each state all the weights of the incoming transitions must be compared to determine the smallest. The two edges per state in this example need only 1 comparison, yielding a total of 8. In total, 28 additions, 8 multiplications, and 8 comparisons are needed per time step. One technique for reducing the number of operations necessary to perform the metric calculation described in the first step will be outlined hereinafter. One of the major concerns which remains to developers is the number of operations needed for the second and third steps. The number of edges in convolutional codes is an exponential function.

In the example provided, each state has two incoming edges, so only one comparison and selection is necessary to determine the transition with the minimum weight. In the general case, the number of edges entering a state is $2^r$ (r is an integer determined by the decoder trellis), which requires r rounds of comparison and selection. In each round of the compare and select process, the edges are grouped into pairs and compared. Of the two, the edge representing the transition with the smaller weight is "selected", which means only that the other edge is dropped from candidacy since it can no longer represent the minimum weight transition. Consequently in each round, half of the edges are dropped from candidacy, and after r rounds, only the edge representing the minimum weight transition remains. The minimum weight transition for a state is referred to as a "survivor", the weight associated with the survivor is referred to as the survivor weight, and the path associated with the survivor is referred to as the survivor path. The survivor weight becomes the weight of the state at time t+1. In the example depicted in FIG. 2b, the survivor path is illustrated with a sequence of thicker lines extending from states ABDEFGH. The survivor weight is the weight of the survivor path culminating at state H as having a weight of 2. State H weight is the sum of all previous transition weights within the survivor path as determined by the summation of the immediate preceding state weight and the metric between the preceding state and the state of interest.

The comparison and selection process must be performed for all states and for every code word received. Computational overhead for a Viterbi decoder can therefore be substantial.

As shown in FIG. 3, Viterbi decoder 130 may be divided into two sub-units: an add-compare-select array (ACS array) 134 and a survivor path unit (SPU) 136. The metric calculation, addition, weight comparison and survivor path selection all take place within the ACS array. Thus, ACS array 134 contains the weight values at each state, as a progression along survivor path. The weight values are necessary, when making a comparison to other weights in other paths, to determine a survivor path. The calculation and comparison functions which take place within the ACS array 134 allow determination of path extensions. Signals indicating the chosen extensions to the survivor paths are passed from the ACS array to the SPU which then updates the survivor paths. The SPU also functions to provide decoded symbol decisions based on the survivor paths. Two popular methods exist for implementing the SPU: the register exchange method, and the traceback method. Only the traceback method is discussed herein.

To illustrate the traceback method, a random access memory (RAM) is used. The RAM is organized into rows and columns. The columns represent time steps, i.e., t=0, t=1, etc. in the decoder trellis, and the rows represent the states, i.e., B,C, etc. at each time step. Each location in the RAM is assumed to hold a pointer to a state in the previous column, the state from which the surviving path to the current state originates. Note that this pointer may take the form of the input bit $I_1$ which would have caused the chosen transition to the current state. This approach requires the addition of some external logic gates which generate the address of the state in the previous column when given the address of the current state and the contents of the current state.

The traceback method operates in the following manner: At each time step, the chosen transitions are stored in a column. One state is chosen as a starting point, and a traceback begins. The traceback consists of repeated reads from the RAM, each read accessing a column which precedes the column last accessed. The row used in each read is specified by the contents of the location last read. In this manner, it is possible to "trace backward" through the RAM and, more specifically, through the decoder trellis as described in FIG. 2b. After tracing backward a fixed number of steps, the last transition is rendered as a decoded bit in similar fashion to the previous method.

Note that in the traceback method, many reads must be performed during each decoding cycle. This places very demanding requirements on the speed of the RAM. Several approaches have been taken in an attempt to address this problem. Utilizing the principle that speed of a RAM typically inversely proportional to its size, some of these approaches focus on substituting several smaller RAM arrays for one larger RAM. Whatever speed is gained in the RAM operation, design complexity is increased by requiring additional decode, read/write, and pointer logic, and the associated requirement for a larger silicon chip area.

In summary, Viterbi decoders are able to provide optimal decoding performance, but possess two separately optimizable components: the survivor weight unit and the survivor path unit. The survivor weight unit typically requires a large number of operations in a single decoder time step. A method which serves to reduce the number of operations required would be advantageous.

SUMMARY OF THE INVENTION

The problems outlined above are in large part solved by a novel survivor weight unit (SWU) which implements a normalized survivor weight calculation method with permutations. This method permutes a vector of survivor weights in a manner which permits calculation of weights by specialized butterfly computation units. The specialization of the butterfly computation units allows for a reduction of storage and computation requirements.

Broadly speaking, the present invention contemplates an apparatus for Viterbi decoding a possibly corrupted encoded signal. The apparatus can determine survivor weights and thereafter store and update survivor paths. The apparatus includes a module which reduces the number of operations required for survivor weight calculation by allowing permutations of the calculated vector of survivor weights. Rather than having a given butterfly computation unit always doing the computations for a given butterfly, thereby requiring that the computation unit be able to handle two types of butterfly computations, a method is provided for re-assigning at each time step the computation units to the butterflies according to the type of butterfly computation required. Implementation of the re-assignment method requires little added complexity, and it allows the butterfly computation units to be specialized for only one type of butterfly computation. Implementation comprises an added routing step that alters the communication of previous state weights to subsequent states.

The present invention further contemplates a digital communications system comprising an encoder, a discrete-time channel, and a Viterbi decoder. The encoder serves to convert a digital signal to an encoded digital signal containing a sequence of code words. The encoded digital signal may then be transmitted through a transmission channel or written to a storage medium and read therefrom. These actions are represented in the form of the discrete-time channel. The encoded and possibly corrupted signal output from the discrete-time channel is received by a Viterbi decoder comprising a circuit for survivor weight determination and a memory for storing and updating survivor paths. The circuit determines permuted vectors of the survivor weights, thereby permitting a reduction in implementation complexity relative to conventional implementations. The permutation (i.e. re-ordering) of survivor weights is such that the desired vector of survivor weight can be found from the calculated vector of survivor weights by placing the weight at position J in position K=J⊕L, where J,K, and L are binary numbers, ⊕ is the bit-wise exclusive-or (XOR) operation, and L is determined by a permutation control unit that directs the routing of survivor weights between specialized butterfly computation units.

The present invention yet further contemplates a method for reducing the number of operations required to implement a survivor weight determination technique for Viterbi decoding. This method includes a permutation step which routes survivor weights requiring certain types of calculations to specialized butterfly computation units. The resulting decisions, which are stored in the form of survivor paths, are in error by a specified permutation, and the decisions may be corrected at the output of the survivor path unit.

BRIEF DESCRIPTION OF THE DRAWINGS

Other objects and advantages of the invention will become apparent upon reading the following detailed description and upon reference to the accompanying drawings in which.

Figures 1, 2:
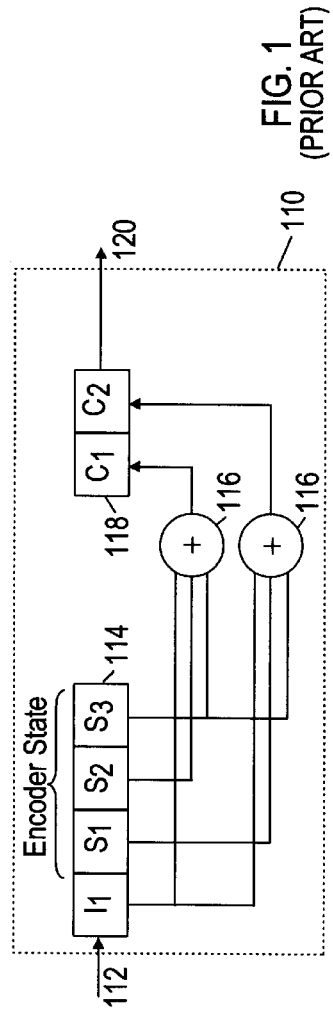
FIG. 1 is a functional schematic diagram of an eight state, rate ½ convolutional encoder.
FIG. 2 is one time step of the trellis diagram of the eight state, rate ½ convolutional code implemented by the encoder of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
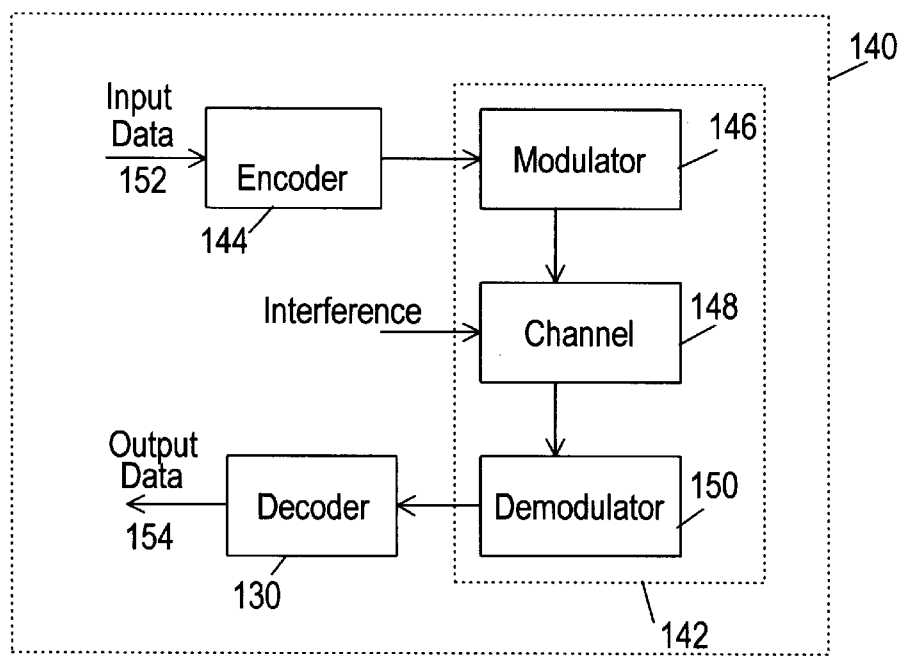
FIG. 4 is a block diagram of a digital communications system which employs error correction coding and subsequent decoding according to the present invention.

Turning now to the drawings, FIG. 4 represents a digital communications system 140 comprising a discrete-time channel 142 interposed between an encoder 144 and a Viterbi decoder 130. Discrete-time channel 142 comprises a modulator 146, a channel 148, and a demodulator 150. Channel 148 may be a transmission channel or a storage medium being written to and read from. Modulator 146 serves to translate a digital output signal from encoder 144 into signals suitable for channel 148, and thereafter drives the signals across channel 148. Channel 148 may suffer from interference that corrupts the transported signals, the interference possibly taking form in any combination of additive noise, cross-channel interference, multi-path interference, and channel fading. Demodulator 150 serves to receive the signals from channel 148 while minimizing the interference as much as is practical, and thereafter translate the signals into digital signals for input to decoder 130. Discrete-time channel 142 can thus be viewed as a unit which accepts digital input signals and produces possibly corrupted digital output signals. A device which can impute noise onto an input signal can therefore be considered a channel and consequently falls within the scope an context of a channel as used herein.

Encoder 144 is a convolutional encoder which serves to add redundancy to input data signal 152. The added redundancy allows for detection and correction of errors that may result from corruption of signals passing across discrete-time channel 142. The error detection and correction is performed by Viterbi decoder 130.

Figure 5:
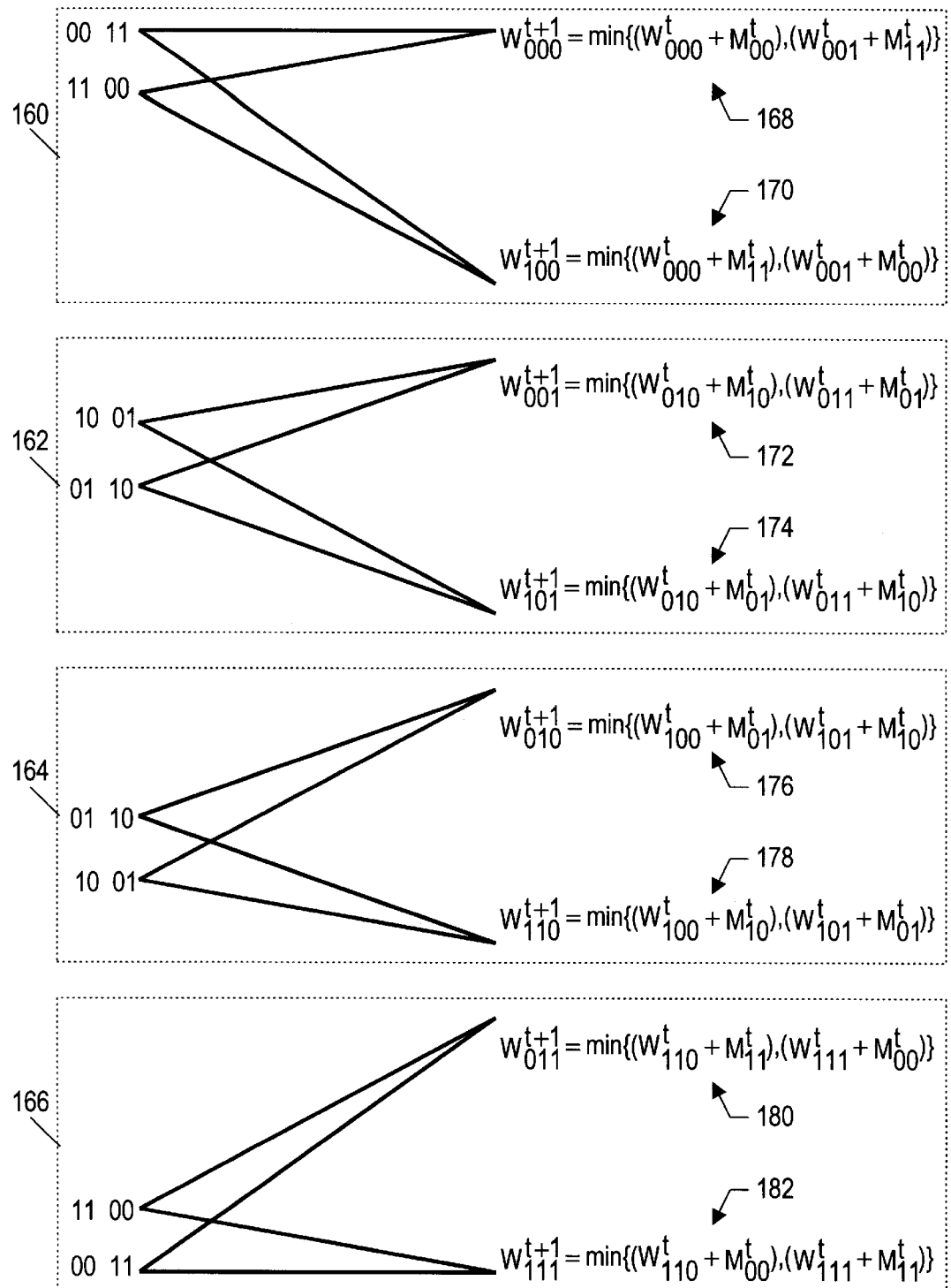
FIG. 5 is a decomposition of the decoder trellis of FIG. 2 into completely connected bipartite graphs.

As shown in FIG. 5, it is possible to decompose a decoder trellis into fully-connected bipartite graphs. A fully-connected bipartite graph is one in which the states of the graph can be divided into two sets such that each of the states in one set is only connected to all of the states in the other set. Colloquially, these graphs are referred to as "butterflies". A more specific meaning is given to this term herein: a butterfly is the set of computations which must be performed as indicated by any one of the fully connected bipartite graphs which form a decoder trellis. The set of operations may vary from implementation to implementation, but it comprises whatever is necessary for a computation unit to determine path extensions and state weights for the states at time t+1 when given the edge metrics and state weights at time t.

Hereafter, a distinction is made between a butterfly and a butterfly computation unit. As before, the butterfly is a set of computations which must be performed. The butterfly computation unit is the circuit which performs the set of computations. The distinction must be emphasized to avoid confusion. The topology of the hardware (the set of butterfly computation units) is the same as the topology of the algorithm (the set of butterflies). Conventionally, the algorithm topology is implemented by the hardware topology. However, the hardware topology also supports variations (permutations) of the algorithm topology. This feature is used to advantage by the present invention.

In FIG. 5, the trellis of FIG. 2 has been decomposed into four butterflies. In conventional Viterbi decoder implementations, each butterfly is handled by a predetermined butterfly computation unit. The butterfly computation unit calculates the survivor weights for two states at time t+1 after receiving the survivor weights for two states at time t and the metrics for the two codewords which are associated with the edges of the butterfly. For example, a butterfly computation unit which realizes butterfly 160 will calculate survivor weights according to formulas 168 and 170. This is the subject of further discussion after metric calculations are explained.

The first step of survivor weight determination is the calculation of edge metrics. Several variants on metric calculation exist. The distance used is typically the squared Euclidean distance. The formula is $$M_c = (y-c)(y-c)^T,$$

where y represents the received signal, c is the code word, and T is the transpose operator. In general y and c are row vectors and this equation is an inner product which yields a scalar value: the sum of the squares of the components of the difference vector. Investigating this relationship more closely it can be determined that no squaring is necessary to calculate useful metrics:

$$M_c = SUM_{i=1,n}\{y_i^2 - 2c_i y_i + c_i^2\}$$

$$M_c = SUM_{i=1,n}\{y_i^2\} + SUM_{i=1,n}\{-2c_i y_i\} + SUM_{i=1,n}\{c_i^2\}$$

The first term in this equation is common to all the metrics. Since the object is to find the minimum weight, subtraction of common value from all metrics will not affect the outcome. Therefore, the first term can be dropped. In reference to the last term, the components $c_i$ of the code word are 0 and 1, hence squaring them has no effect. The metric equation is therefore reduced and now reads:

$$M_c = SUM_{i=1,n}\{c_i(1-2y_i)\}$$

which can be scaled by ½ without affecting the results to yield:

$$M_c = SUM_{i=1,n}\{c_i(0.5-y_i)\}.$$

This calculation is easily performed by passing the decoder input 132 through a dc-offset circuit, gating the output based on whether $c_i$ is 0 or 1, and summing the components using a resistor network.

This approach is extended for the discussed embodiment in the following way: the final edge metrics are found by subtracting the minimum metric from each of the metrics as calculated above. Once again, subtracting a common value from all metrics will not affect the outcome. However, this does provide a normalization of path weights in that the minimum survivor path weight will always be zero and all other path weights are specified relative to the minimum survivor path weight. The resulting edge metrics can then be stated in the following way: let D be the set of bit positions in which a code word c differs from the minimum code word. Then $$M_c^t = \sum_{i \in D} |0.5 - y_i|.$$

Hereafter, the absolute value of $(0.5-y_i)$ will be represented as $z_i$. Hence, for the two bit codewords of FIG. 5, the edge metrics will be 0, $z_1$, $z_2$, and $z_1+z_2$. These metrics will correspond to the code words that are obtained by XOR-ing the "best" code word with 00, 10, 01, and 11, respectively.

As previously described, the weight of each transition is the sum of the weight of the state it originates from and the metric of the code word that corresponds to that transition. This is the next step in the survivor weight determination. The weight of each state at time t+1 is found by choosing the minimum weight of the incoming transitions. The expressions in FIG. 5 are used to evaluate the weight of the states at time t+1. For example, the equation 172, repeated below, is evaluated in the following manner: the weight of state 001 at time t+1 is the minimum of either (1) the weight of state 010 at time t plus the metric for code word 10, or (2) the weight of state 011 at time t plus the metric for code word 01.

$$W_{001}{}^{t+1} = min\{W_{010}{}^t + M_{10}{}^t), (W_{011}{}^t + M_{01}{}^t)\}$$

For the present example, each state has only two incoming transitions (i.e., for every state at time t+1 there are two incoming transitions from two states at time t), but in general the number of incoming transitions may be a larger power of two. A larger number of incoming transitions has the effect of necessitating additional comparisons to eliminate candidates for the minimum weight transition. For each state at time t+1, a signal representing which transition is selected is passed to SPU 136.

Figure 6:
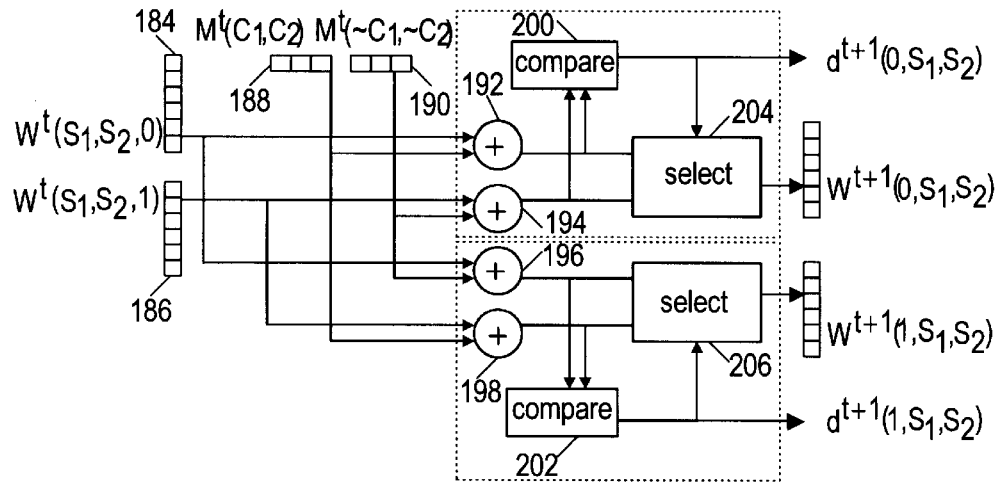
FIG. 6 is a block diagram of a conventional dual add-compare-select unit (DACSU) which serves as a butterfly computation unit for a rate ½ Viterbi decoder.

FIG. 6 shows a conventional butterfly computation unit 190 which could be used to implement butterfly 160. For butterfly 160, $S_1, S_2, C_1$, and $C_2$ are all equal to zero. The two path weights $W^t(000)$ and $W^t(001)$ are stored as two six-bit numbers 184 and 186, while the metrics $M^T(00)$ and $M^t(11)$ are stored as two three-bit numbers 188 and 190. This resolution is sufficient to allow no more than a 0.2 dB loss in signal to noise ratio due to quantization. Four six-bit adders 192–198 are used to generate weights for the four possible extensions of the survivor paths. Two six-bit comparators 186 and 188 are used to compare the pairs of extensions that reach a common state, and two select units (i.e. multiplexers) 204 and 206 are used to route the minimum path weight to storage. Also, two decision bits (denoted $d^{t+1}$) are provided to indicate which of the two extensions ending in each common state was selected as a survivor. These bits are routed to the second stage of the Viterbi detector (SPU 136).

FIGS. 7a–7d show the four types of butterflies that are present in the decoder trellis. These four types can be grouped into two categories according to the edge metrics they use. The butterflies in FIGS. 7a and 7b both use the metrics for codewords 01 and 10. Similarly, the other two butterflies use the metrics for codewords 00 and 11. Distinguishing the butterflies into two categories in this manner permits the following observation: at each time step, half of the butterflies will work with the edge metric values 0 and $z_1+z_2$; the other half will work with the values $z_1$ and $z_2$. This observation results from the realization that in all of the butterflies, the second edge metric in a butterfly differs from the first edge metric in two bit locations. Consequently, the butterflies that use the "best" code word in a given time instant will work with metric values 0 and $z_1+z_2$. Meanwhile, both of the edge metrics in the other category of butterfly differ in exactly one bit location from the "best" code word, and the metric values used will be $z_1$ and $z_2$. Exactly which category of butterfly will benefit from the value 0 edge metric is impossible to say, before determining which code word is closest to the received signal. Nevertheless, it is possible to design a specialized butterfly computation unit that takes advantage of the value 0 edge metric while being general enough to perform the calculations for both butterfly categories. To do this, it is necessary to provide a time-varying assignment of the butterfly computation units to the decoding trellis butterflies.

Figure 2B:
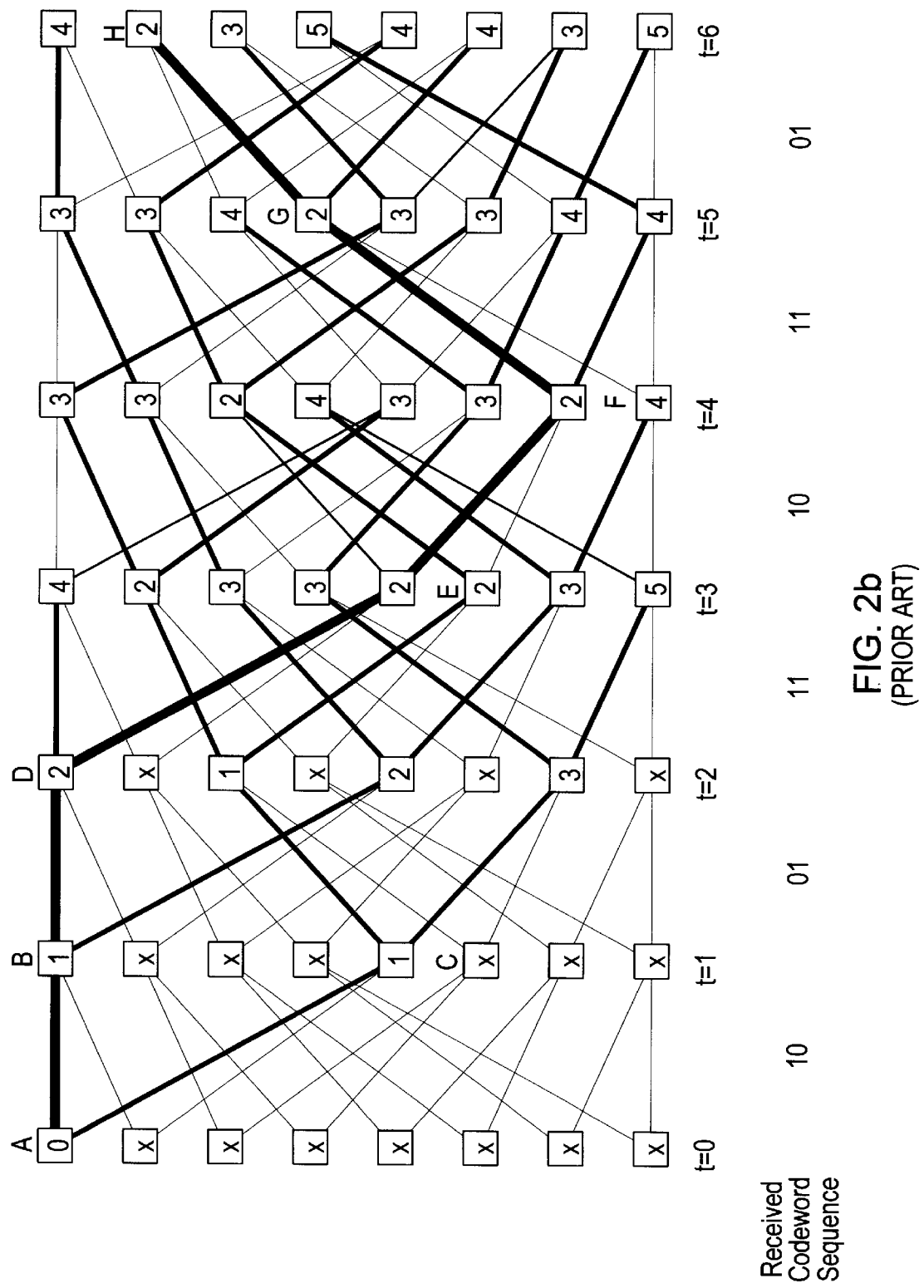
FIG. 2b is an expanded trellis diagram of the eight state, rate ½ convolutional code illustrating the algorithm whereby weights are assigned to possible encoder states in the decoding of a received code word sequence.
Figure 3:
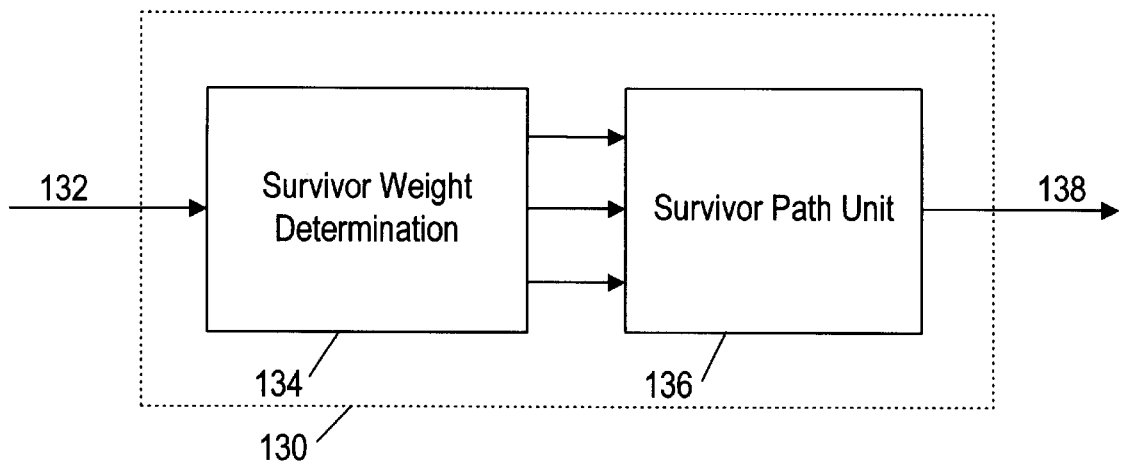
FIG. 3 is a block diagram of a Viterbi decoder.

A study of FIG. 2, with reference to FIG. 2b, will reveal that each butterfly in the decoder trellis communicates one of the time t+1 state weights to each of the two categories of butterflies. Hence, it is always true that one of the time t+1 state weights will be sent to a butterfly computation unit which uses the metric values $z_1$ and $z_2$. The other time t+1 state weight will be sent to a butterfly computation unit which uses the metric values 0 and $z_1+z_2$. The strategy becomes one of creating two types of butterfly computation units. The first type of butterfly computation unit will always use the metric values $z_1$ and $z_2$. The second type will always use the metric values 0 and $z_1+z_2$. Before the next signal word is received, it is unknown which code word will be "best", and hence it is unknown which category of butterfly the first type of butterfly computation unit will implement. So too for the second type of butterfly computation unit. Without this knowledge, it can not be determined which of the two time t+1 state weights should be communicated to the first type of computation unit, and which should be communicated to the second type of butterfly computation unit. Once the next signal word is received, a determination of the "best" code word is made, the assignment of butterfly categories to butterfly computation unit types is decided, and the state weights routed accordingly. The assignment process of categories to computation unit types will be discussed further once the computation unit implementations have been discussed.

Figure 7:
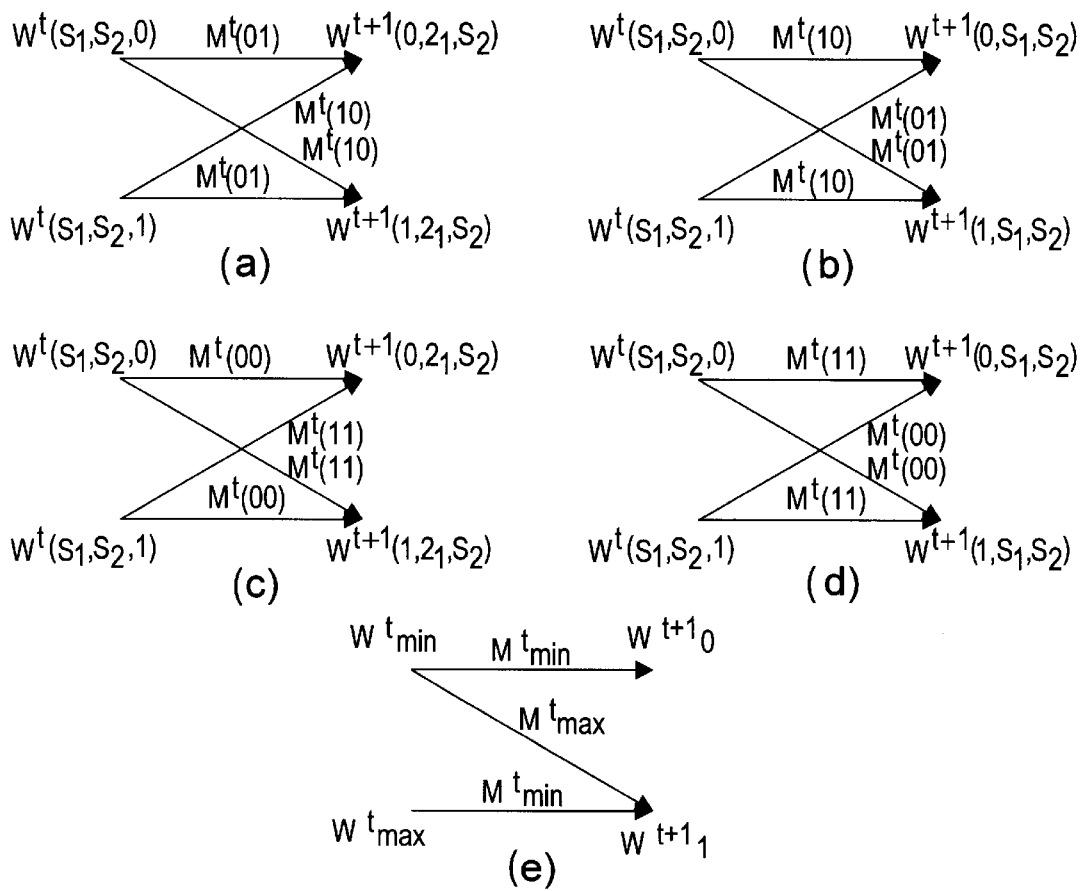
FIG. 7 is a signal flow diagram illustrating the required computations for the completely connected bipartite graphs of FIG. 5.

FIG. 7e shows the basis which is used for the implementation of the specialized butterfly computation units. Clearly, one of the surviving paths from a butterfly will have the path weight $W^{t+1}_0 = W^t_{min} + M^t_{min}$. Equally clearly, none of the surviving paths will have the weight $W^t_{max} + M^t_{max}$. The remaining decision that must be made is in the following calculation:

$$W^{t+1}_1 = min\{(W^t_{min}+M^t_{max}), (W^t_{max}+M^t_{min})\},$$

which can be manipulated in the following way:

$$W^{t+1}_1 = min\{(W^t_{min}+M^t_{min}+\Delta M^t), (W^t_{min}+\Delta W^t+M^t_{min})\},$$

where $\Delta M^t = M^t_{max} - M^t_{min}$ and $\Delta W^t = W^t_{max} - W^t_{min}$. The common terms can be extracted to yield:

$$W^{t+1}_1 = (W^t_{min}+M^t_{min}) + min\{\Delta M^t, \Delta W^t\}.$$

The reason for the manipulation of weight calculations becomes clear once the following is considered. The number of operations performed by a butterfly computation unit using the original equations is four additions and two comparisons. The number of operations performed by a butterfly computation unit using the new equations is two subtractions, one comparison, and two additions. Furthermore, if one of the metrics is known to be zero, the butterfly computation unit can further eliminate one addition and one subtraction. These gains will clarified and extended below.

Figure 8:
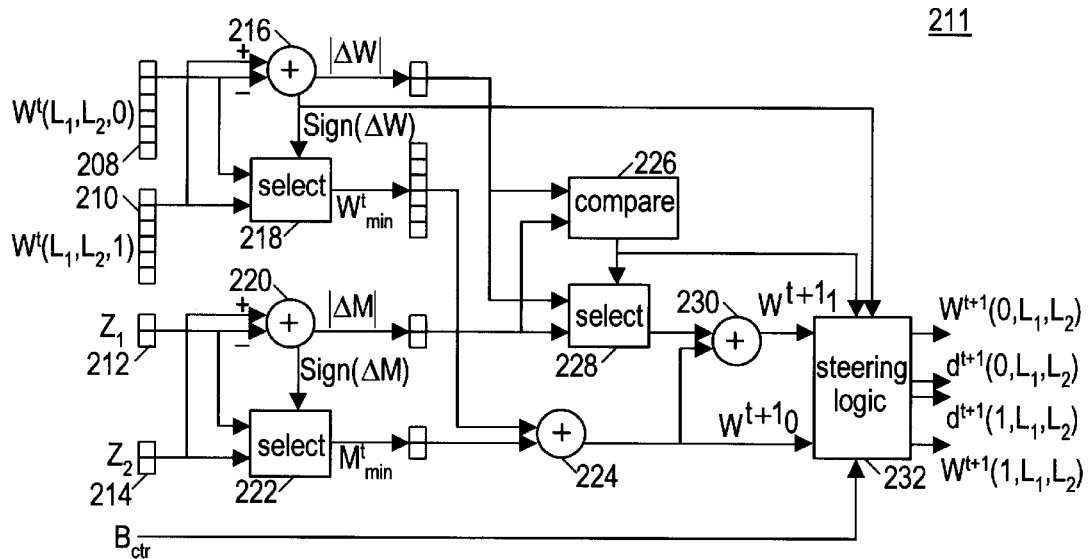
FIG. 8 is a block diagram of a specialized butterfly computation unit of a first type for a rate ½ Viterbi decoder.

FIG. 8 illustrates an implementation of a "type I" butterfly computation unit 211. This implementation assumes that neither of the two edge metrics has the value zero. Hence, it is operating with the two values $z_1$ 212 and $z_2$ 214. To operate with the same resolution as the conventional butterfly computation unit of FIG. 6, which allows a maximum metric of three bits, the intermediate metric values need only be represented by two bits. Hence, the edge metrics can now be stored with only two bits of resolution since it is assumed that the maximum metric value ($z_1+z_2$) will be handled by a second ("type II") butterfly computation unit implementation. The two incoming path weights 208 and 210, are compared 216 and the minimum is selected 218. Similarly, the two incoming edge metrics 212 and 214, are compared 220 and the minimum is selected 222. The minimum path weight is then added 224 to the minimum edge metric to generate $W^{t+1}_1$. When the comparisons 216 and 220 are performed between weights and metrics, the weight difference $\Delta W^t$ and the metric difference $\Delta M^t$ are found. The two differences are compared 226 and the minimum difference is selected 228. Note that the resolution of $\Delta W^t$ can be limited to two bits since if it requires more, it will be larger than $\Delta M^t$ and will not be used. The minimum difference is then added to $W^{t+1}_0$ to form $W^{t+1}_1$. The two path weights $W^{t+1}_0$ and $W^{t+1}_1$ must then be steered to their final destinations, and this is done by logic gates 232 based on the results of the comparisons 216 and 226, and the current permutation as represented by $B_{ctr}$. It should be pointed out that the calculation of $\Delta M^t$ 220 and the determination of $M^t_{min}$ 222 are operations that are shared by half of the butterfly computation units, and hence can be performed once and distributed. The type I butterfly computation unit implementation would then consist of 3 six-bit adders, 1 two-bit comparator, 2 selects (multiplexers), and some steering logic. This is to be compared with the conventional implementation which required 4 six-bit adders, 2 six-bit comparators, and 2 selects (multiplexers).

Figure 9:
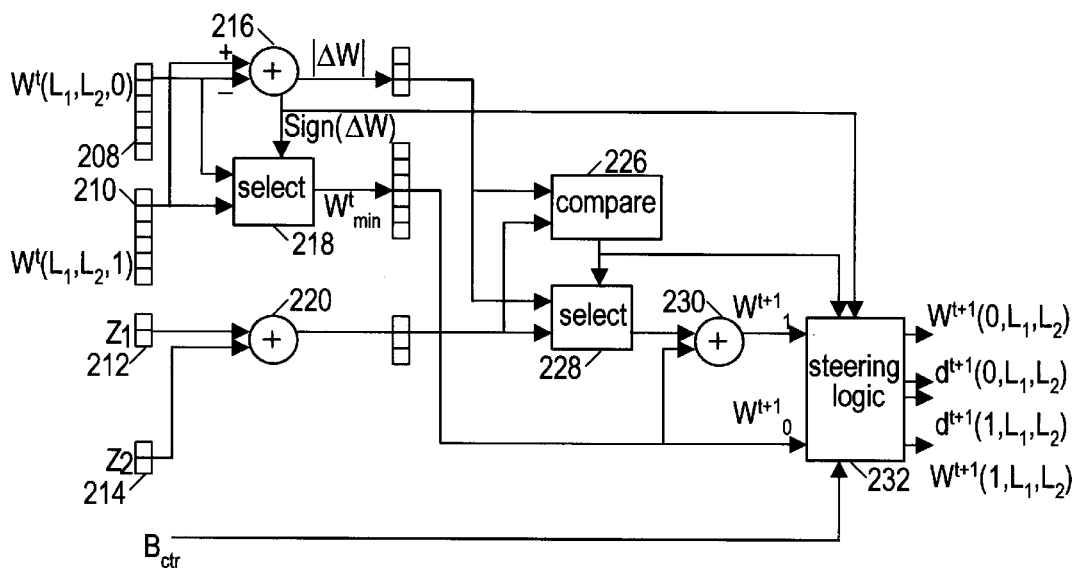
FIG. 9 is a block diagram of a specialized butterfly computation unit of a second type for a rate ½ Viterbi decoder.

FIG. 9 illustrates a "type II" butterfly computation unit implementation. This implementation assumes that one of the two edge metrics is zero, and that the second edge metric is $z_1+z_2$. As in the type I butterfly computation unit, the path weights 208 and 210 are compared 216, the minimum is selected 218, and a difference is formed. The result of the edge metric comparison is known beforehand since one of the metrics is zero. The type II butterfly computation unit then simply sets $W^{t+1}_0 = W^t_{min}$ (thus avoiding the use of an adder corresponding to adder 224 in FIG. 8). The $\Delta M^t$ is known to be ($z_1+z_2$)−0, which requires three bits for storage (to have the same resolution as the conventional implementation). The two differences are compared 226, and the minimum is selected 228 and added 230 to $W^{t+1}_0$ to form $W^{t+1}_1$. The two path weights $W^{t+1}_0$ and $W^{t+1}_1$ must then be steered to their final destinations, and this is done by logic gates 232 based on the results of the comparisons 216 and 226, and based on the current permutation as represented by $B_{ctr}$. It should be pointed out that the calculation 220 of $\Delta M^t$ is an operation that is shared by half of the butterfly computation units, and hence can be performed once and distributed. The type II butterfly computation unit implementation would then consist of 2 six-bit adders, 1 three-bit comparator, 2 selects, and some steering logic.

The operations which are shared by multiple type I computation units are 1 two bit adder and 1 select. The operation shared by multiple type II computation units is 1 two bit adder. Assuming two computation units of each type, the total number of operations for one time step of the decoder trellis is: 10 six-bit adders, 2 two-bit adders, 2 three-bit comparators, 2 two-bit comparators, 9 selects, 4 sets of steering logic. This is to be compared with the conventional implementation which requires 16 six-bit adders, 8 six-bit comparators, and 8 selects. The comparison becomes even more favorable for typical convolutional decoders which have a larger number of butterfly computation units.

It is apparent that a reduction in butterfly computation unit complexity is attainable by specializing the butterfly computation units into two types, each type able to perform the computations associated with half of the butterflies at each time step in the decoder trellis. Since the type of computation unit that must be used for a given category of butterfly varies with time, a method is provided hereinafter for permuting the assignment of butterfly computation units to butterflies so as to ensure an operational correspondence.

An assignment is hereby defined to be a one-to-one correspondence between butterflies and butterfly computation units. A permutation is a re-ordering of an assignment which yields a one-to-one correspondence.

A distinction is hereby made between the Viterbi decoder trellis (i.e. the algorithm) which has states labeled by bits $S_1, S_2$, and $S_3$; and the butterfly computation unit trellis (i.e. the hardware) which has states labeled by bits $L_1, L_2$, and $L_3$. The one-to-one correspondence between the two trellises is given by $$(S_1, S_2, S_3) = (L_1 \oplus \Lambda_t, L_2 \oplus \Lambda_{t-1}, L_3 \oplus \Lambda_{t-2}),$$

where $\oplus$ represents the XOR operation, and $\Lambda_t$ is a bit which is set as needed to ensure an operational correspondence between the butterfly computation units and the butterflies. The correspondence is one in which the butterflies of the category which use a zero edge metric are performed by the type II butterfly computation units (in FIG. 9) and the butterflies of the category with two non-zero edge metrics are performed by the type I butterfly computation units (in FIG. 8). When these permutations are invoked, i.e. when $\Lambda_t$ is set to 1, this has the effect of inverting the hardware decoded bit at time t. The inversions are most easily corrected by feeding the $\Lambda_t$ sequence through a delay line and using it to perform an XOR operation on the decoded output.

The $B_{ctr}$ signal is a binary signal that specifies the relative alignment of the edge metrics within the butterfly. In other words, the $B_{ctr}$ signal is used to distinguish between FIG. 7a and FIG. 7b, or equivalently, between FIG. 7c and FIG. 7d. As such, it is a function of the past permutations and the code generators.

Figure 10:
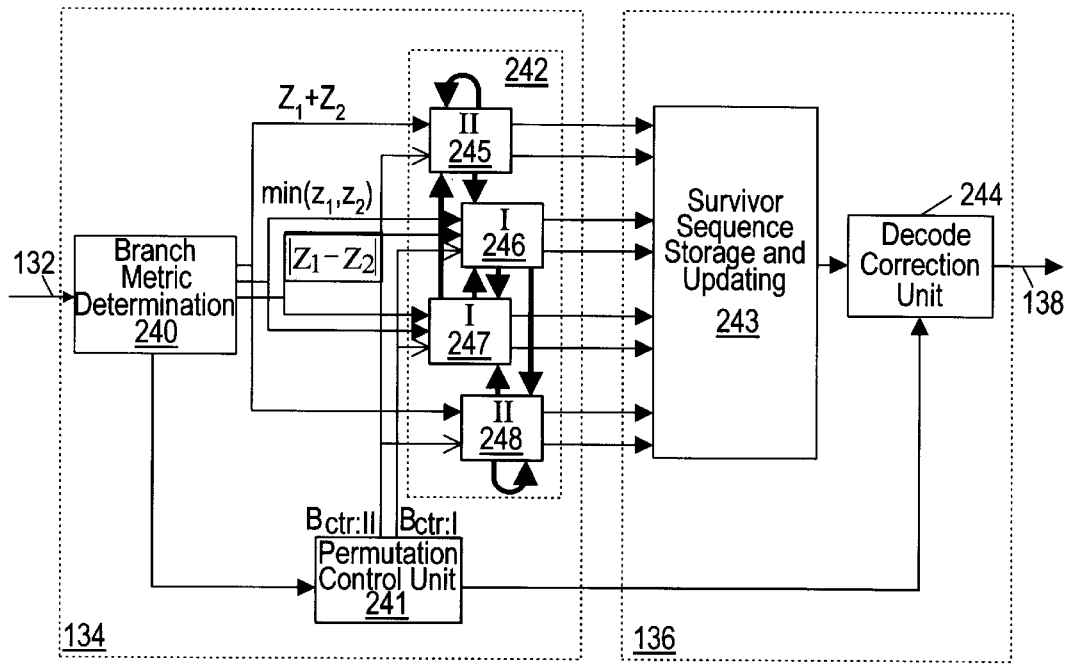
FIG. 10 is a block diagram illustrating one embodiment of a Viterbi decoder for an eight-state rate ½ convolutional code.
Figure 11:
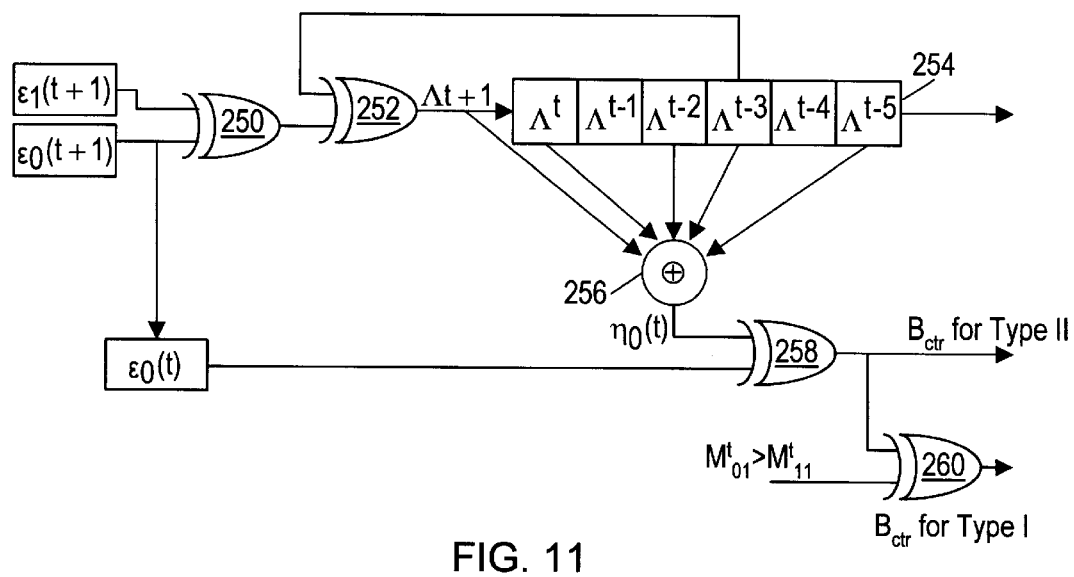
FIG. 11 is a block diagram of a permutation control unit for a Viterbi decoder of a standard rate ½ convolutional code.

FIG. 10 illustrates the relationships between the components previously discussed. A SWU 134 comprises a edge metric determination unit 240 which operates to produce the edge metrics $z_1$, $z_2$, and $z_1 + z_2$ as described previously. For the type I computation units, edge metric determination unit 240 provides the edge metric difference $|z_1 - z_2|$ and the minimum $\min(z_1, z_2)$. For the type II computation units, since one of the edge metrics is zero, only the edge metric difference $(z_1 + z_2) - 0$ is provided. The edge metric differences and minimum edge metrics are passed to an array 242 of butterfly computation units, half of which are type I and the other half of which are type II. The operation of array 242 is controlled by a permutation control unit 241. Operation of permutation control unit 241 will be further described below. Decisions from array 242 are communicated to SPU 136 which comprises a memory 243 configured to store, update and decode survivor paths. SPU 136 further includes a decoding correction unit 244 which receives and appropriately delays permutation decisions executed by permutation control unit 241. Thereafter, the decode correction unit uses the permutation decisions to correct the output of memory 243 as suggested previously.

One standard convolutional code which has widespread use is a rate ½, K=7 code with the following generator polynomials (in octal): (133,171). This code has 64 possible encoder states, so there are 64 states at each time step in the decoder lattice. To implement the decoder lattice requires that array 242 comprise 32 butterfly computation units, 16 of each type. Each of the possible encoder states is specified by a shift register which contains the six previous input bits to the encoder. Permutation control unit 241 for this standard convolutional code is shown in FIG. 10. The sequences $\epsilon_0(t)$ and $\epsilon_1(t)$ are defined according to the "best" code word in the following manner:

at time t, $M^t(\epsilon_0(t), \epsilon_1(t)) = 0$.

Consequently, the output signal from gate 250 indicates whether the zero metric will be associated with the category of trellis butterflies of FIGS. 7a and 7b, or the category of butterflies of FIGS. 7c and 7d. The permutation bit is then set by gate 252 based on the output of gate 250 and a four-times delayed permutation bit. The permutation bit then enters a shift register 254 like that of the convolutional encoder. One of the code generators (octal 133) is used to determine the connections to a modulo 2 summer 256 which in turn provides a signal to indicate the alignment of edge metrics for the butterfly computations of type II butterfly computation units. Due to the structure of the butterfly computation units, this alignment is inverted if the one-time delayed version of $\epsilon_0(t)$ is non-zero. Given the alignment for the type II butterfly computation units, one further comparison between the metrics $M^t_{01}$ and $M^t_{11}$, is necessary to determine the final alignment for the type I butterfly computation units.

In summary to what has been presented above, a Viterbi decoder has been described which determines state weights from previous state weights and code word metrics. The state weights calculated by choosing the minimum incoming transition weight (found by adding a code word metric to a previous state weight) correspond to probabilities for the "survivor" paths that reach the states. To allow specialization of butterfly computation units, the decoder trellis states do not have fixed assignments to specific butterfly computation units as is conventionally done. Rather, the assignment may be altered at each time step by a permutation. When a permutation is executed, this has the effect of inverting the information bit to be decoded for that time step.

By maintaining a record of a survivor path for each state (i.e. the most likely sequence of transitions to reach that state), the overall decision as to which path constitutes "the correct" path through the decoder trellis can be postponed until some criterion is met. One possible criterion is a simple predetermined delay. At this time, a decision is made by choosing the current state with the smallest weight. The "correct" (i.e. most likely) path may be found by "tracing back" through the trellis. This path can then be decoded from left to right according to the stipulation that taking the uppermost transition leaving a state corresponds to a decoded zero, and that taking the lowermost transition leaving a state yields a decoded one. The decoded information bits are then inverted if the decoder time step at the time they were received was subject to a permutation.

It should be recognized that although a metric based on Euclidean distance was used for the discussed embodiment, other metrics may also be used, including a metric based on an absolute value of the difference between the received signal and a codeword.

Numerous variations and modifications will become apparent to those skilled in the art once the above disclosure is fully appreciated. For example, other methods than the traceback technique may be employed in the second stage of the Viterbi decoder. It is intended that the following claims be interpreted to embrace all such variations and modifications.

What is claimed is:

1. An apparatus for Viterbi decoding which comprises a survivor weight unit which includes:
   a metric unit configured to receive an encoded signal and compute a pair of metric values which corresponds to a plurality of transitions between a pair of states at time t to a pair of states at time t+1;
   an array of first and second computation units coupled together to implement a decoder trellis time step between time t and time t+1, half of said array being composed of first computation units of a first type and half of said array being composed of second computation units of a second type, wherein a chosen computation unit is configured to select a surviving one of said plurality of transitions for each of the pair of states at time t+1, said chosen computation unit still further configured to calculate a surviving weight for each of the pair of states at time t+1;
   a permutation control unit configured to steer the output of the computation units so as to (i) ensure that the chosen computation unit is one of said first computation units if each of said pair of metric values is nonzero and to (ii) ensure that the chosen computation unit is one of said second computation units if one of said pair of metric values is zero.

2. The apparatus for Viterbi decoding as recited in claim 1, which further comprises a survivor path unit coupled to said survivor weight unit to receive the surviving one of said plurality of transitions, said survivor path unit configured to update and store a survivor path for each state in the decoder trellis and to decode said encoded signal by tracing one of said survivor paths; said survivor path unit includes:
   a decoding correction unit coupled to said permutation control unit to receive a correction signal, said decoding correction unit is further coupled to receive a decoded signal with errors, said decoding correction unit is configured provide a corrected decoded signal.

3. The apparatus for Viterbi decoding as recited in claim 1 wherein said first computation units of the first type are coupled to receive two non-zero metric values and two path weights, said first computation units are configured to determine a minimum metric and a metric difference, said first computation units are further configured to determine a minimum path weight and a path weight difference, said first computation units are further configured to determine a minimum difference by comparing said metric difference with said path weight difference, said first computation units are further configured to calculate a first new path weight by summing said minimum metric with said minimum path weight, and said first computation units are still further configured to calculate a second new path weight by adding to the first new path weight said minimum difference.

4. The apparatus for Viterbi decoding as recited in claim 1 wherein said second computation units of the second type are coupled to receive one non-zero metric and two path weights, said second computation units are configured to determine a minimum path weight and a path weight difference, said second computation units are further configured to determine a minimum difference by comparing said metric with said path weight difference, said second computation units are further configured to provide as a first new path weight said minimum path weight, and said second computation units are still further configured to calculate a second new path weight by adding to the first new path weight said minimum difference.

5. A digital communications system which comprises:
   an encoder coupled to receive a digital signal and thereafter provide an encoded signal;
   a discrete-time channel which comprises:
      a modulator configured to receive said encoded signal and thereafter provide a continuous time signal representative of said encoded signal;
      a channel coupled to receive and carry said continuous time signal; and
      a demodulator coupled to receive an output signal from said channel and thereafter provide essentially said encoded signal; and
   a decoder which comprises a survivor weight unit which includes:
      a metric unit coupled to receive said encoded signal and compute a pair of metric values which corresponds to a plurality of transitions between a pair of states at time t to a pair of states at time t+1;
      an array of first and second computation units coupled together to implement a decoder trellis time step between time t and time t+1, half of said array being composed of first computation units of a first type and half of said array being composed of second computation units of a second type, wherein a chosen computation unit is configured to select a surviving one of said plurality of transitions for each of the pair of states at time t+1, said chosen computation unit still further configured to calculate a surviving weight for each of the pair of states at time t+1; and
      a permutation control unit configured to steer the output of the computation units so as to (i) ensure that the chosen computation unit is one of said first computation units if each of said pair of metric values is nonzero and to (ii) ensure that the chosen computation unit is one of said second computation units if one of said pair of metric values is zero.

6. The digital communications system as recited in claim 5, which further comprises a survivor path unit coupled to said survivor weight unit to receive the surviving one of said plurality of transitions, said survivor path unit configured to update and store a survivor path for each state in the decoder trellis and to decode said encoded signal by tracing one of said survivor paths; said survivor path unit includes:
   a decoding correction unit coupled to said permutation control unit to receive a correction signal, said decoding correction unit is further coupled to receive a decoded signal with errors, said decoding correction unit is configured provide a corrected decoded signal.

7. The digital communications system as recited in claim 5 wherein said first computation units of the first type are coupled to receive two non-zero metric values and two path weights, said first computation units are configured to determine a minimum metric and a metric difference, said first computation units are further configured to determine a minimum path weight and a path weight difference, said first computation units are further configured to determine a minimum difference by comparing said metric difference with said path weight difference, said first computation units are further configured to calculate a first new path weight by summing said minimum metric with said minimum path weight, and said first computation units are still further configured to calculate a second new path weight by adding to the first new path weight said minimum difference.

8. The digital communications system as recited in claim 5 wherein said second computation units of the second type are coupled to receive one non-zero metric and two path weights, said second computation units are configured to determine a minimum path weight and a path weight difference, said second computation units are further configured to determine a minimum difference by comparing said metric with said path weight difference, said second computation units are further configured to provide as a first new path weight said minimum path weight, and said second computation units are still further configured to calculate a second new path weight by adding to the first new path weight said minimum difference.

9. A method for error correcting a digital signal, comprising:

encoding a digital signal to one of a plurality of code words, two of said code words corresponding to four transitions from two possible first encoder states to two possible second encoder states, wherein the second encoder states occur subsequent to said first encoder states, and wherein said first encoder states form a part of respective survivor paths of a sequence of transitions between encoder states;

forwarding said code word across a discrete-time channel which is susceptible to imputed noise;

calculating two metrics which correspond to said two codewords and determining the existence of a first case in which said two metrics are nonzero, or the existence of a second case in which exactly one of said two metrics is nonzero;

in the first case,
  determining a minimum metric and a metric difference from said two metrics;
  determining a minimum path weight and a path weight difference from two path weights associated with said two possible first encoder states;
  determining a minimum difference from said metric difference and said path weight difference;
  calculating a first new path weight by summing said minimum metric with said minimum path weight;
  calculating a second new path weight by adding to the first new path weight said minimum difference;
  determining a correspondence between said new path weights and said second encoder states by operating on the results of the minimum metric determination, the minimum path weight determination, and the minimum difference determination;
  determining two extensions to said survivor paths by operating on the results of the minimum metric determination, the minimum path weight determination, and the minimum difference determination;

in the second case,
  determining a minimum path weight and a path weight difference from two path weights associated with said two possible first encoder states;
  determining a minimum difference from said nonzero metric and said path weight difference;
  providing as a first new path weight said minimum path weight;
  calculating a second new path weight by adding to the first new path weight said minimum difference;
  determining a correspondence between said new path weights and said second encoder states by operating on the results of the minimum path weight determination, and the minimum difference determination;
  determining two extensions to said survivor paths by operating on the results of the minimum path weight determination, and the minimum difference determination;

error correcting said imputed noise from the encoded digital signal by constructing a most likely survivor path and making one or more decoding decisions based thereon.

* * * * *